United States Patent
Weeks et al.

(10) Patent No.: US 10,468,245 B2
(45) Date of Patent: Nov. 5, 2019

(54) SEMICONDUCTOR DEVICE INCLUDING COMPOUND SEMICONDUCTOR MATERIALS AND AN IMPURITY AND POINT DEFECT BLOCKING SUPERLATTICE

(71) Applicant: ATOMERA INCORPORATED, Los Gatos, CA (US)

(72) Inventors: Keith Doran Weeks, Chandler, AZ (US); Nyles Wynn Cody, Tempe, AZ (US); Marek Hytha, Brookline, MA (US); Robert J. Mears, Wellesley, MA (US); Robert John Stephenson, Duxford (GB)

(73) Assignee: ATOMERA INCORPORATED, Los Gatos, CA (US)

( * ) Notice: Subject to any disclaimer, the term of this patent is extended or adjusted under 35 U.S.C. 154(b) by 0 days.

(21) Appl. No.: 15/916,766

(22) Filed: Mar. 9, 2018

(65) Prior Publication Data
US 2019/0279868 A1    Sep. 12, 2019

(51) Int. Cl.
| H01L 21/02 | (2006.01) |
| H01L 21/322 | (2006.01) |
| H01L 21/28 | (2006.01) |
| H01L 29/20 | (2006.01) |
| H01L 29/78 | (2006.01) |
| H01L 29/66 | (2006.01) |

(Continued)

(52) U.S. Cl.
CPC .. *H01L 21/02507* (2013.01); *H01L 21/28273* (2013.01); *H01L 21/3228* (2013.01); *H01L 29/0653* (2013.01); *H01L 29/1054* (2013.01); *H01L 29/155* (2013.01); *H01L 29/2003* (2013.01); *H01L 29/66462* (2013.01); *H01L 29/7851* (2013.01); *H01L 29/78696* (2013.01)

(58) Field of Classification Search
CPC ......... H01L 21/02507; H01L 21/28273; H01L 21/3228
See application file for complete search history.

(56) References Cited

U.S. PATENT DOCUMENTS

| 4,937,204 A | 6/1990 | Ishibashi et al. |
| 5,216,262 A | 6/1993 | Tsu |

(Continued)

FOREIGN PATENT DOCUMENTS

| GB | 2347520 | 6/2000 |
| JP | 62222626 | 9/1987 |

OTHER PUBLICATIONS

Waldron et al. "Integration of InGaAs Channel n-MOS Devices on 200mm Si Wafers Using the Aspect-Ratio-Trapping Technique" 2 ECS—The Electrochemical Society: 2012; pp. 14.

(Continued)

*Primary Examiner* — Errol V Fernandes
(74) *Attorney, Agent, or Firm* — Allen, Dyer, Doppelt + Gilchrist, P.A.

(57) ABSTRACT

A semiconductor device may include a substrate including a first Group IV semiconductor having a recess therein, an active layer comprising a Group III-V semiconductor within the recess, and a buffer layer between the substrate and active layer and comprising a second Group IV semiconductor. The semiconductor device may further include an impurity and point defect blocking superlattice layer adjacent the buffer layer.

25 Claims, 11 Drawing Sheets

(51) Int. Cl.
*H01L 29/15* (2006.01)
*H01L 29/06* (2006.01)
*H01L 29/786* (2006.01)
*H01L 29/10* (2006.01)

(56) References Cited

U.S. PATENT DOCUMENTS

| | | |
|---|---|---|
| 5,357,119 A | 10/1994 | Wang et al. |
| 5,683,934 A | 11/1997 | Candelaria |
| 5,796,119 A | 8/1998 | Seabaugh |
| 6,141,361 A | 10/2000 | Mears et al. |
| 6,376,337 B1 | 4/2002 | Wang et al. |
| 6,472,685 B2 | 10/2002 | Takagi |
| 6,741,624 B2 | 5/2004 | Mears et al. |
| 6,830,964 B1 | 12/2004 | Mears et al. |
| 6,833,294 B1 | 12/2004 | Mears et al. |
| 6,878,576 B1 | 4/2005 | Mears et al. |
| 6,891,188 B2 | 5/2005 | Mears et al. |
| 6,897,472 B2 | 5/2005 | Mears et al. |
| 6,927,413 B2 | 8/2005 | Mears et al. |
| 6,952,018 B2 | 10/2005 | Mears et al. |
| 6,958,486 B2 | 10/2005 | Mears et al. |
| 6,993,222 B2 | 1/2006 | Mears et al. |
| 7,018,900 B2 | 3/2006 | Kreps |
| 7,033,437 B2 | 4/2006 | Mears et al. |
| 7,034,329 B2 | 4/2006 | Mears et al. |
| 7,045,377 B2 | 5/2006 | Mears et al. |
| 7,045,813 B2 | 5/2006 | Mears et al. |
| 7,071,119 B2 | 7/2006 | Mears et al. |
| 7,105,895 B2 | 9/2006 | Wang et al. |
| 7,109,052 B2 | 9/2006 | Mears et al. |
| 7,123,792 B1 | 10/2006 | Mears et al. |
| 7,148,712 B1 | 12/2006 | Prey, Jr. et al. |
| 7,153,763 B2 | 12/2006 | Hytha et al. |
| 7,202,494 B2 | 4/2007 | Blanchard et al. |
| 7,227,174 B2 | 6/2007 | Mears et al. |
| 7,229,902 B2 | 6/2007 | Mears et al. |
| 7,265,002 B2 | 9/2007 | Mears et al. |
| 7,279,699 B2 | 10/2007 | Mears et al. |
| 7,279,701 B2 | 10/2007 | Kreps |
| 7,288,457 B2 | 10/2007 | Kreps |
| 7,303,948 B2 | 12/2007 | Mears et al. |
| 7,432,524 B2 | 10/2008 | Mears et al. |
| 7,435,988 B2 | 10/2008 | Mears et al. |
| 7,436,026 B2 | 10/2008 | Kreps |
| 7,446,002 B2 | 11/2008 | Mears et al. |
| 7,446,334 B2 | 11/2008 | Mears et al. |
| 7,491,587 B2 | 2/2009 | Rao |
| 7,514,328 B2 | 4/2009 | Rao |
| 7,517,702 B2 | 4/2009 | Halilov et al. |
| 7,531,828 B2 | 5/2009 | Mears et al. |
| 7,531,829 B2 | 5/2009 | Blanchard |
| 7,531,850 B2 | 5/2009 | Blanchard |
| 7,586,116 B2 | 9/2009 | Kreps et al. |
| 7,586,165 B2 | 9/2009 | Blanchard |
| 7,598,515 B2 | 10/2009 | Mears et al. |
| 7,612,366 B2 | 11/2009 | Mears et al. |
| 7,625,767 B2 | 12/2009 | Huang et al. |
| 7,659,539 B2 | 2/2010 | Kreps et al. |
| 7,700,447 B2 | 4/2010 | Dukovski et al. |
| 7,718,996 B2 | 5/2010 | Dukovski et al. |
| 7,781,827 B2 | 8/2010 | Rao |
| 7,812,339 B2 | 10/2010 | Mears et al. |
| 7,863,066 B2 | 1/2011 | Mears et al. |
| 7,880,161 B2 | 2/2011 | Mears et al. |
| 7,928,425 B2 | 4/2011 | Rao |
| 8,389,974 B2 | 3/2013 | Mears et al. |
| 9,275,996 B2 | 3/2016 | Mears et al. |
| 9,406,753 B2 | 8/2016 | Mears et al. |
| 9,558,939 B1 | 1/2017 | Stephenson et al. |
| 9,899,479 B2 | 2/2018 | Mears et al. |
| 2003/0034529 A1 | 2/2003 | Fitzgerald et al. |
| 2003/0057416 A1 | 3/2003 | Currie et al. |
| 2006/0220118 A1 | 10/2006 | Stephenson et al. |
| 2007/0012910 A1 | 1/2007 | Mears et al. |
| 2007/0020833 A1 | 1/2007 | Mears et al. |
| 2008/0012004 A1 | 1/2008 | Huang et al. |
| 2008/0258134 A1 | 10/2008 | Mears et al. |
| 2010/0289116 A1 | 11/2010 | Lin et al. |
| 2011/0215299 A1 | 9/2011 | Rao |
| 2012/0032234 A1* | 2/2012 | Wang ............ H01L 21/02381 257/200 |
| 2015/0144878 A1* | 5/2015 | Mears ............ H01L 21/8238 257/20 |
| 2015/0171202 A1* | 6/2015 | Takahashi ...... H01L 29/66356 257/194 |
| 2015/0357414 A1 | 12/2015 | Mears |
| 2016/0099317 A1 | 4/2016 | Mears et al. |
| 2016/0149023 A1 | 5/2016 | Mears et al. |
| 2016/0336406 A1 | 11/2016 | Mears et al. |
| 2016/0358773 A1 | 12/2016 | Mears et al. |
| 2017/0294514 A1 | 10/2017 | Mears |
| 2017/0301757 A1 | 10/2017 | Mears et al. |
| 2017/0330609 A1 | 11/2017 | Roy |
| 2018/0040714 A1 | 2/2018 | Mears et al. |
| 2018/0040724 A1 | 2/2018 | Mears et al. |
| 2018/0040725 A1 | 2/2018 | Mears et al. |
| 2018/0040743 A1 | 2/2018 | Mears et al. |

OTHER PUBLICATIONS

U.S. Appl. No. 15/664,028, filed Jul. 31, 2017.
U.S. Appl. No. 15/678,616, filed Aug. 16, 2017.
U.S. Appl. No. 15/678,658, filed Aug. 16, 2017.
U.S. Appl. No. 15/842,981, filed Dec. 15, 2017.
U.S. Appl. No. 15/842,989, filed Dec. 15, 2017.
U.S. Appl. No. 15/842,990, filed Dec. 15, 2017.
U.S. Appl. No. 15/842,993, filed Dec. 15, 2017.
U.S. Appl. No. 15/843,013, filed Dec. 15, 2017.
U.S. Appl. No. 15/843,017, filed Dec. 15, 2017.
U.S. Appl. No. 15/843,044, filed Dec. 15, 2017.
U.S. Appl. No. 15/843,077, filed Dec. 15, 2017.
U.S. Appl. No. 15/843,106, filed Dec. 15, 2017.
U.S. Appl. No. 15/843,113, filed Dec. 15, 2017.
U.S. Appl. No. 15/843,121, filed Dec. 15, 2017.
U.S. Appl. No. 15/843,136, filed Dec. 15, 2017.
Luo et al., "Chemical Design of Direct-Gap Light-Emitting Silicon" published in Physical Review Letters, vol. 89, No. 7; Aug. 12, 2002; 4 pgs.
Mears et al. "Simultaneous Carrier Transport Enhancement and variability reduction in Si MOSFETs by insertion of partial Monolayers of oxygen" IEEE silicon Nanoelectronics Workshop (2012): (Date of conference Jun. 10-11, 2012) pp. 2.
Novikov et al. "Silicon-based Optoelectronics" 1999-2003, pp. 1-6.
R. Tsu Phenomena in silicon nanostructure device published online Sep. 6, 2000 by Applied Physics and Materials Science & Processing, pp. 391-402.
Raphael. Tsu "Si Based Green ELD: Si-Oxygen Superlattice" wysiwyg://l/http://www3.interscience.wiley.com/cgi-bin/abstract/72512946/start: published online Jul. 21, 2000; 2 pgs. Abstract Only.
Xu et al. "Effectiveness of Quasi-confinement technology for improving P-chanel Si an Ge MOSSFET performance" Department of Electrical Engineering and Computer Science, University of California, Berkeley, 2012, pp. 2. mearstech.net; retrieved from internet Jan. 18, 2016.
Xu et al. "Extension of planar bulk n-channel MOSFET scaling with oxygen insertion technology" IEEE Transactions on Electron devices, vol. 61, No. 9; Sep. 2014. pp. 3345-3349.
Xu et al., "MOSFET performance and scalability enhancement by insertion of oxygen layers", Department of Electrical Engineering and Computer Science, University of California, Berkeley, 2012, pp. 1-4.
U.S. Appl. No. 15/916,831, filed Mar. 9, 2018.
Razeghi et al., "Recent advances in III-V compounds on silicon", Prog. Crystal Growth and Charact., vol. 19, 1989, pp. 21-37.

* cited by examiner

SEMICONDUCTOR DEVICE INCLUDING COMPOUND SEMICONDUCTOR MATERIALS AND AN IMPURITY AND POINT DEFECT BLOCKING SUPERLATTICE

TECHNICAL FIELD

The present disclosure generally relates to semiconductor devices and, more particularly, to enhanced materials and fabrication techniques for semiconductor devices.

BACKGROUND

Structures and techniques have been proposed to enhance the performance of semiconductor devices, such as by enhancing the mobility of the charge carriers. For example, U.S. Patent Application No. 2003/0057416 to Currie et al. discloses strained material layers of silicon, silicon-germanium, and relaxed silicon and also including impurity-free zones that would otherwise cause performance degradation. The resulting biaxial strain in the upper silicon layer alters the carrier mobilities enabling higher speed and/or lower power devices. Published U.S. Patent Application No. 2003/0034529 to Fitzgerald et al. discloses a CMOS inverter also based upon similar strained silicon technology.

U.S. Pat. No. 6,472,685 B2 to Takagi discloses a semiconductor device including a silicon and carbon layer sandwiched between silicon layers so that the conduction band and valence band of the second silicon layer receive a tensile strain. Electrons having a smaller effective mass, and which have been induced by an electric field applied to the gate electrode, are confined in the second silicon layer, thus, an n-channel MOSFET is asserted to have a higher mobility.

U.S. Pat. No. 4,937,204 to Ishibashi et al. discloses a superlattice in which a plurality of layers, less than eight monolayers, and containing a fractional or binary or a binary compound semiconductor layer, are alternately and epitaxially grown. The direction of main current flow is perpendicular to the layers of the superlattice.

U.S. Pat. No. 5,357,119 to Wang et al. discloses a Si—Ge short period superlattice with higher mobility achieved by reducing alloy scattering in the superlattice. Along these lines, U.S. Pat. No. 5,683,934 to Candelaria discloses an enhanced mobility MOSFET including a channel layer comprising an alloy of silicon and a second material substitutionally present in the silicon lattice at a percentage that places the channel layer under tensile stress.

U.S. Pat. No. 5,216,262 to Tsu discloses a quantum well structure comprising two barrier regions and a thin epitaxially grown semiconductor layer sandwiched between the barriers. Each barrier region consists of alternate layers of SiO2/Si with a thickness generally in a range of two to six monolayers. A much thicker section of silicon is sandwiched between the barriers.

An article entitled "Phenomena in silicon nanostructure devices" also to Tsu and published online Sep. 6, 2000 by Applied Physics and Materials Science & Processing, pp. 391-402 discloses a semiconductor-atomic superlattice (SAS) of silicon and oxygen. The Si/O superlattice is disclosed as useful in a silicon quantum and light-emitting devices. In particular, a green electroluminescence diode structure was constructed and tested. Current flow in the diode structure is vertical, that is, perpendicular to the layers of the SAS. The disclosed SAS may include semiconductor layers separated by adsorbed species such as oxygen atoms, and CO molecules. The silicon growth beyond the adsorbed monolayer of oxygen is described as epitaxial with a fairly low defect density. One SAS structure included a 1.1 nm thick silicon portion that is about eight atomic layers of silicon, and another structure had twice this thickness of silicon. An article to Luo et al. entitled "Chemical Design of Direct-Gap Light-Emitting Silicon" published in Physical Review Letters, Vol. 89, No. 7 (Aug. 12, 2002) further discusses the light emitting SAS structures of Tsu.

Published International Application WO 02/103,767 A1 to Wang, Tsu and Lofgren, discloses a barrier building block of thin silicon and oxygen, carbon, nitrogen, phosphorous, antimony, arsenic or hydrogen to thereby reduce current flowing vertically through the lattice more than four orders of magnitude. The insulating layer/barrier layer allows for low defect epitaxial silicon to be deposited next to the insulating layer.

Published Great Britain Patent Application 2,347,520 to Mears et al. discloses that principles of Aperiodic Photonic Band-Gap (APBG) structures may be adapted for electronic bandgap engineering. In particular, the application discloses that material parameters, for example, the location of band minima, effective mass, etc., can be tailored to yield new aperiodic materials with desirable band-structure characteristics. Other parameters, such as electrical conductivity, thermal conductivity and dielectric permittivity or magnetic permeability are disclosed as also possible to be designed into the material.

Furthermore, U.S. Pat. No. 6,376,337 to Wang et al. discloses a method for producing an insulating or barrier layer for semiconductor devices which includes depositing a layer of silicon and at least one additional element on the silicon substrate whereby the deposited layer is substantially free of defects such that epitaxial silicon substantially free of defects can be deposited on the deposited layer. Alternatively, a monolayer of one or more elements, preferably comprising oxygen, is absorbed on a silicon substrate. A plurality of insulating layers sandwiched between epitaxial silicon forms a barrier composite.

Despite the existence of such approaches, further enhancements may be desirable for using advanced semiconductor processing techniques in certain applications.

SUMMARY

A semiconductor device may include a substrate including a first Group IV semiconductor having a recess therein, an active layer comprising a Group III-V semiconductor within the recess, and a buffer layer between the substrate and active layer and comprising a second Group IV semiconductor. The semiconductor device may further include an impurity and point defect blocking superlattice layer adjacent the buffer layer.

More particularly, the impurity and point defect blocking superlattice layer may include a plurality of stacked groups of layers, with each group of layers including a plurality of stacked base semiconductor monolayers defining a base semiconductor portion, and at least one non-semiconductor monolayer constrained within a crystal lattice of adjacent base semiconductor portions. By way of example, the base semiconductor layers may comprise silicon and/or germanium. Moreover, the at least one non-semiconductor monolayer may include at least one of oxygen, nitrogen, fluorine, carbon and carbon-oxygen.

In accordance with one example embodiment, the impurity and point defect blocking superlattice layer may be between the substrate and the buffer layer. In accordance with another example, a first impurity and point defect blocking superlattice layer may be between the substrate and the buffer layer, and a second impurity and point defect blocking superlattice layer may be between the buffer layer and the active layer.

By way of example, the first Group IV semiconductor may comprise silicon, and the second Group IV semiconductor may comprise germanium. Furthermore, the Group III-V semiconductor may comprise InP, for example. Additionally, the semiconductor device may also include a channel layer on the active layer, a gate on the channel layer, and a source and a drain on opposite sides of the gate. Moreover, the group III-V semiconductor of the active layer may comprise a first group III-V semiconductor, and the channel layer may comprise a second Group III-V semiconductor different than the first Group III-V semiconductor. By way of example, the second Group III-V semiconductor may comprise InGaAs. The source and drain may also comprise the second Group III-V semiconductor.

DETAILED DESCRIPTION

The present disclosure will now be described more fully hereinafter with reference to the accompanying drawings, in which example embodiments are shown. However, many different forms may be implemented based upon the teachings set forth herein, and the disclosure should not be construed as limited to the specific example embodiments provided. Rather, these embodiments are provided so that this disclosure will be thorough and complete, and will fully convey the disclosed concepts to those skilled in the art. Like numbers refer to like elements throughout, and prime notation is used to indicate similar elements in different embodiments.

Applicants theorize, without wishing to be bound thereto, that certain superlattices as described herein reduce the effective mass of charge carriers and that this thereby leads to higher charge carrier mobility. Effective mass is described with various definitions in the literature. As a measure of the improvement in effective mass Applicants use a "conductivity reciprocal effective mass tensor", $M_e^{-1}$ and $M_h^{-1}$ for electrons and holes respectively, defined as:

$$M_{e,i,j}^{-1}(E_F, T) = \frac{\sum_{E>E_F} \int_{B.Z.} (\nabla_k E(k,n))_i (\nabla_k E(k,n))_j \frac{\partial f(E(k,n), E_F, T)}{\partial E} d^3k}{\sum_{E>E_F} \int_{B.Z.} f(E(k,n), E_F, T) d^3k}$$

for electrons and:

$$M_{h,i,j}^{-1}(E_F, T) = \frac{-\sum_{E<E_F} \int_{B.Z.} (\nabla_k E(k,n))_i (\nabla_k E(k,n))_j \frac{\partial f(E(k,n), E_F, T)}{\partial E} d^3k}{\sum_{E<E_F} \int_{B.Z.} (1 - f(E(k,n), E_F, T)) d^3k}$$

for holes, where f is the Fermi-Dirac distribution, $E_F$ is the Fermi energy, T is the temperature, E(k,n) is the energy of an electron in the state corresponding to wave vector k and the $n^{th}$ energy band, the indices i and j refer to Cartesian coordinates x, y and z, the integrals are taken over the Brillouin zone (B.Z.), and the summations are taken over bands with energies above and below the Fermi energy for electrons and holes respectively.

Applicants' definition of the conductivity reciprocal effective mass tensor is such that a tensorial component of the conductivity of the material is greater for greater values of the corresponding component of the conductivity reciprocal effective mass tensor. Again Applicants theorize without wishing to be bound thereto that the superlattices described herein set the values of the conductivity reciprocal effective mass tensor so as to enhance the conductive properties of the material, such as typically for a preferred direction of charge carrier transport. The inverse of the appropriate tensor element is referred to as the conductivity effective mass. In other words, to characterize semiconductor material structures, the conductivity effective mass for electrons/holes as described above and calculated in the direction of intended carrier transport is used to distinguish improved materials.

Applicants have identified improved materials or structures for use in semiconductor devices. More specifically, the Applicants have identified materials or structures having energy band structures for which the appropriate conductivity effective masses for electrons and/or holes are substantially less than the corresponding values for silicon. In addition to the enhanced mobility characteristics of these structures, they may also be formed or used in such a manner that they provide piezoelectric, pyroelectric, and/or ferroelectric properties that are advantageous for use in a variety of different types of devices, as will be discussed further below.

Figure 1:
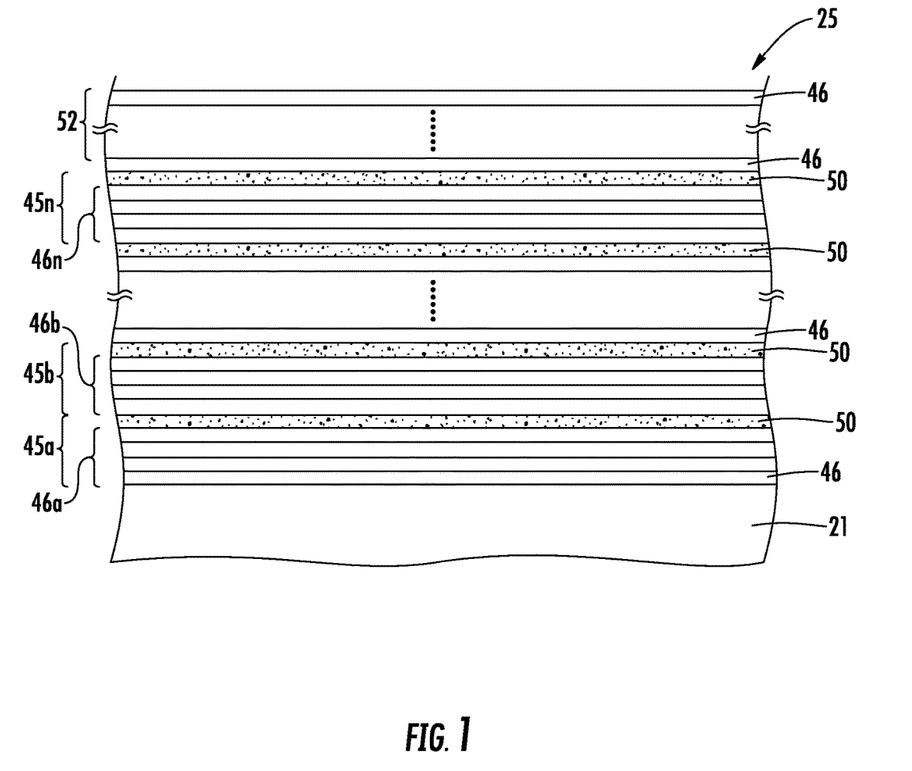
FIG. 1 is a greatly enlarged schematic cross-sectional view of a superlattice for use in a semiconductor device in accordance with the present invention.
Figure 2:
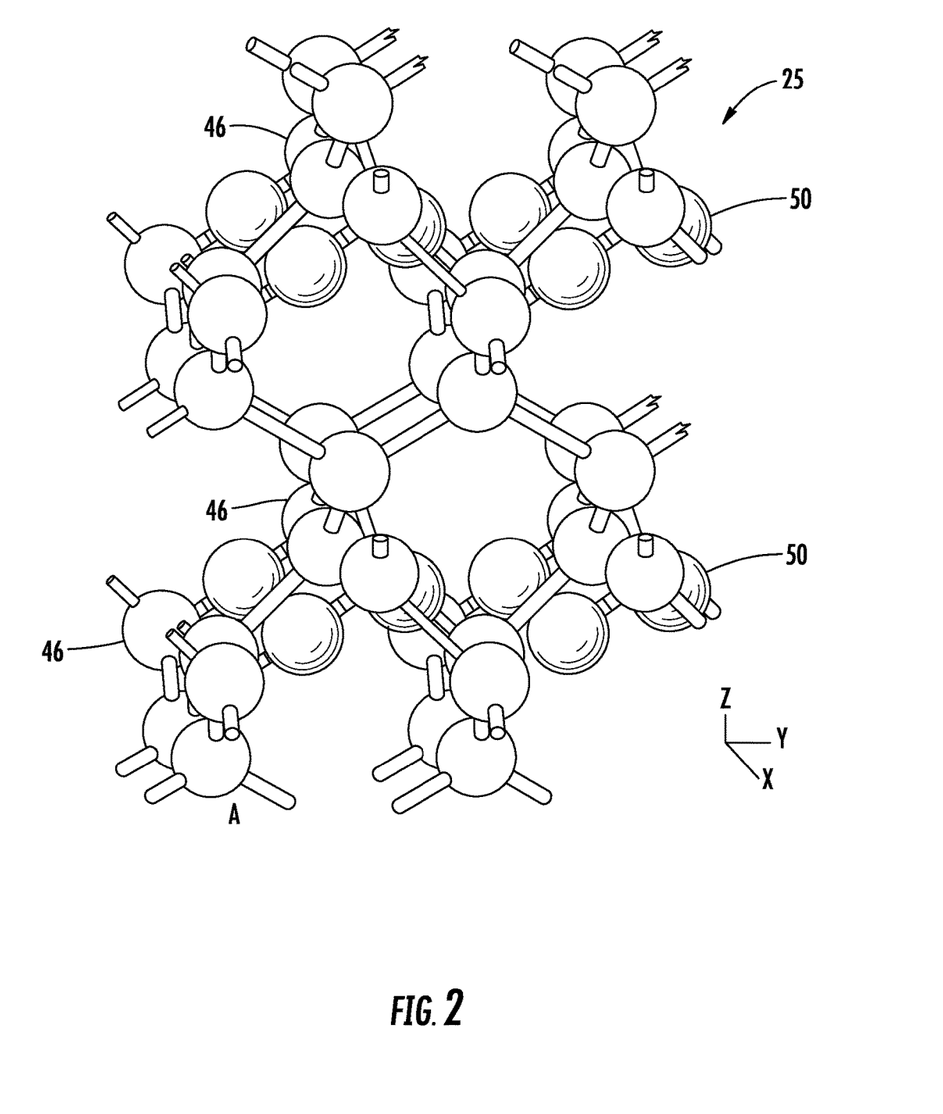
FIG. 2 is a perspective schematic atomic diagram of a portion of the superlattice shown in FIG. 1.

Referring now to FIGS. 1 and 2, the materials or structures are in the form of a superlattice 25 (which is also referred to as an "MST" material or layer herein) whose structure is controlled at the atomic or molecular level and may be formed using known techniques of atomic or molecular layer deposition. The superlattice 25 includes a plurality of layer groups 45a-45n arranged in stacked relation, as perhaps best understood with specific reference to the schematic cross-sectional view of FIG. 1.

Each group of layers 45a-45n of the superlattice 25 illustratively includes a plurality of stacked base semiconductor monolayers 46 defining a respective base semiconductor portion 46a-46n and an energy band-modifying layer 50 thereon. The energy band-modifying layers 50 are indicated by stippling in FIG. 1 for clarity of illustration.

The energy band-modifying layer 50 illustratively includes one non-semiconductor monolayer constrained within a crystal lattice of adjacent base semiconductor portions. By "constrained within a crystal lattice of adjacent base semiconductor portions" it is meant that at least some semiconductor atoms from opposing base semiconductor portions 46a-46n are chemically bound together through the non-semiconductor monolayer 50 therebetween, as seen in FIG. 2. Generally speaking, this configuration is made possible by controlling the amount of non-semiconductor material that is deposited on semiconductor portions 46a-46n through atomic layer deposition techniques so that not all (i.e., less than full or 100% coverage) of the available semiconductor bonding sites are populated with bonds to non-semiconductor atoms, as will be discussed further below. Thus, as further monolayers 46 of semiconductor material are deposited on or over a non-semiconductor monolayer 50, the newly deposited semiconductor atoms will populate the remaining vacant bonding sites of the semiconductor atoms below the non-semiconductor monolayer.

In other embodiments, more than one such non-semiconductor monolayer may be possible. It should be noted that reference herein to a non-semiconductor or semiconductor monolayer means that the material used for the monolayer would be a non-semiconductor or semiconductor if formed in bulk. That is, a single monolayer of a material, such as silicon, may not necessarily exhibit the same properties that it would if formed in bulk or in a relatively thick layer, as will be appreciated by those skilled in the art.

Applicants theorize without wishing to be bound thereto that energy band-modifying layers 50 and adjacent base semiconductor portions 46a-46n cause the superlattice 25 to have a lower appropriate conductivity effective mass for the charge carriers in the parallel layer direction than would otherwise be present. Considered another way, this parallel direction is orthogonal to the stacking direction. The band modifying layers 50 may also cause the superlattice 25 to have a common energy band structure, while also advantageously functioning as an insulator between layers or regions vertically above and below the superlattice.

Moreover, this superlattice structure may also advantageously act as a barrier to dopant and/or material diffusion between layers vertically above and below the superlattice 25. These properties may thus advantageously allow the superlattice 25 to provide an interface for high-K dielectrics which not only reduces diffusion of the high-K material into the channel region, but which may also advantageously reduce unwanted scattering effects and improve device mobility, as will be appreciated by those skilled in the art.

It is also theorized that semiconductor devices including the superlattice 25 may enjoy a higher charge carrier mobility based upon the lower conductivity effective mass than would otherwise be present. In some embodiments, and as a result of the band engineering achieved by the present invention, the superlattice 25 may further have a substantially direct energy bandgap that may be particularly advantageous for opto-electronic devices, for example.

The superlattice 25 also illustratively includes a cap layer 52 on an upper layer group 45n. The cap layer 52 may comprise a plurality of base semiconductor monolayers 46. The cap layer 52 may have between 2 to 100 monolayers of the base semiconductor, and, more preferably between 10 to 50 monolayers.

Each base semiconductor portion 46a-46n may comprise a base semiconductor selected from the group consisting of Group IV semiconductors, Group III-V semiconductors, and Group II-VI semiconductors. Of course, the term Group IV semiconductors also includes Group IV-IV semiconductors, as will be appreciated by those skilled in the art. More particularly, the base semiconductor may comprise at least one of silicon and germanium, for example.

Each energy band-modifying layer 50 may comprise a non-semiconductor selected from the group consisting of oxygen, nitrogen, fluorine, carbon and carbon-oxygen, for example. The non-semiconductor is also desirably thermally stable through deposition of a next layer to thereby facilitate manufacturing. In other embodiments, the non-semiconductor may be another inorganic or organic element or compound that is compatible with the given semiconductor processing as will be appreciated by those skilled in the art. More particularly, the base semiconductor may comprise at least one of silicon and germanium, for example It should be noted that the term monolayer is meant to include a single atomic layer and also a single molecular layer. It is also noted that the energy band-modifying layer 50 provided by a single monolayer is also meant to include a monolayer wherein not all of the possible sites are occupied (i.e., there is less than full or 100% coverage). For example, with particular reference to the atomic diagram of FIG. 2, a 4/1 repeating structure is illustrated for silicon as the base semiconductor material, and oxygen as the energy band-modifying material. Only half of the possible sites for oxygen are occupied in the illustrated example.

In other embodiments and/or with different materials this one-half occupation would not necessarily be the case as will be appreciated by those skilled in the art. Indeed it can be seen even in this schematic diagram, that individual atoms of oxygen in a given monolayer are not precisely aligned along a flat plane as will also be appreciated by those of skill in the art of atomic deposition. By way of example, a preferred occupation range is from about one-eighth to one-half of the possible oxygen sites being full, although other numbers may be used in certain embodiments.

Silicon and oxygen are currently widely used in conventional semiconductor processing, and, hence, manufacturers will be readily able to use these materials as described herein. Atomic or monolayer deposition is also now widely used. Accordingly, semiconductor devices incorporating the superlattice 25 in accordance with the invention may be readily adopted and implemented, as will be appreciated by those skilled in the art.

It is theorized without Applicants wishing to be bound thereto that for a superlattice, such as the Si/O superlattice, for example, that the number of silicon monolayers should desirably be seven or less so that the energy band of the superlattice is common or relatively uniform throughout to achieve the desired advantages. The 4/1 repeating structure shown in FIGS. 1 and 2, for Si/O has been modeled to indicate an enhanced mobility for electrons and holes in the X direction. For example, the calculated conductivity effective mass for electrons (isotropic for bulk silicon) is 0.26 and for the 4/1 SiO superlattice in the X direction it is 0.12 resulting in a ratio of 0.46. Similarly, the calculation for holes yields values of 0.36 for bulk silicon and 0.16 for the 4/1 Si/O superlattice resulting in a ratio of 0.44.

While such a directionally preferential feature may be desired in certain semiconductor devices, other devices may benefit from a more uniform increase in mobility in any direction parallel to the groups of layers. It may also be beneficial to have an increased mobility for both electrons and holes, or just one of these types of charge carriers as will be appreciated by those skilled in the art.

The lower conductivity effective mass for the 4/1 Si/O embodiment of the superlattice 25 may be less than two-thirds the conductivity effective mass than would otherwise occur, and this applies for both electrons and holes. Of course, the superlattice 25 may further comprise at least one type of conductivity dopant therein, as will also be appreciated by those skilled in the art.

Figure 3:
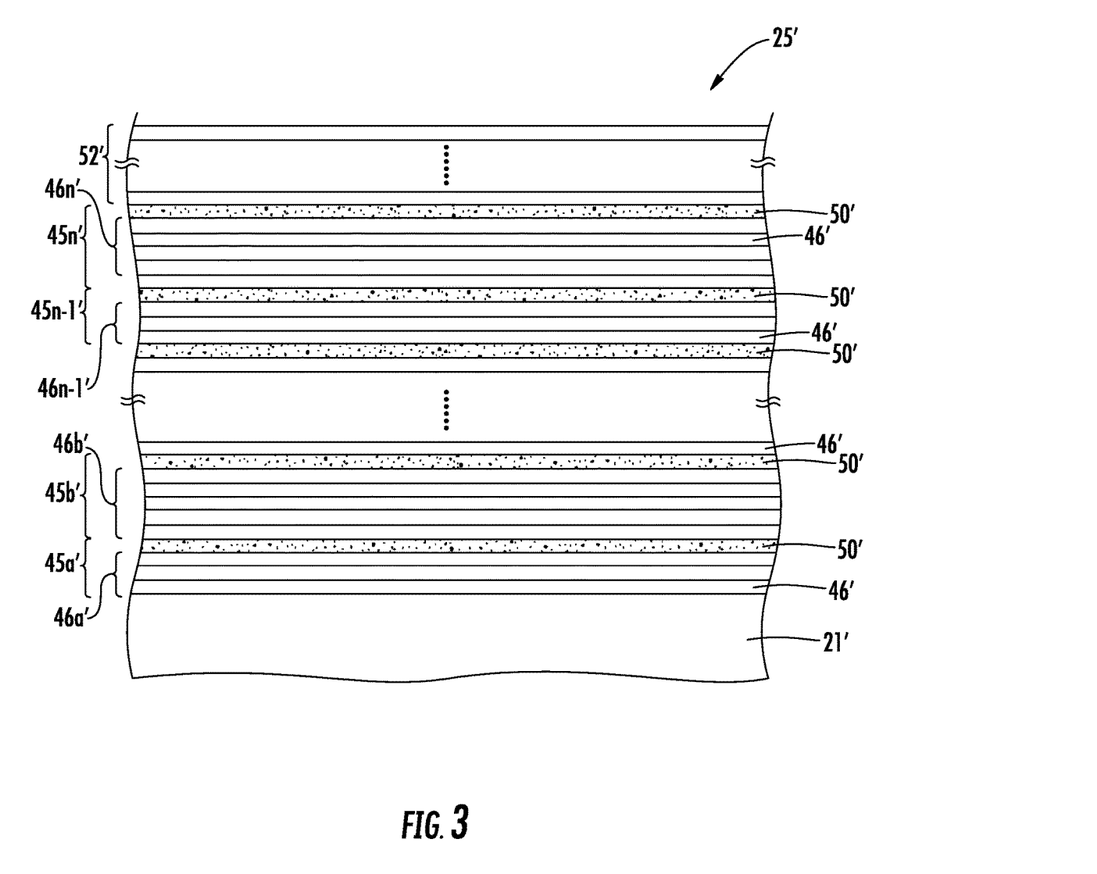
FIG. 3 is a greatly enlarged schematic cross-sectional view of another embodiment of a superlattice in accordance with the invention.

Indeed, referring now additionally to FIG. 3, another embodiment of a superlattice 25' in accordance with the invention having different properties is now described. In this embodiment, a repeating pattern of 3/1/5/1 is illustrated. More particularly, the lowest base semiconductor portion 46a' has three monolayers, and the second lowest base semiconductor portion 46b' has five monolayers. This pattern repeats throughout the superlattice 25'. The energy band-modifying layers 50' may each include a single monolayer. For such a superlattice 25' including Si/O, the enhancement of charge carrier mobility is independent of orientation in the plane of the layers. Those other elements of FIG. 3 not specifically mentioned are similar to those discussed above with reference to FIG. 1 and need no further discussion herein.

In some device embodiments, all of the base semiconductor portions of a superlattice may be a same number of monolayers thick. In other embodiments, at least some of the base semiconductor portions may be a different number of monolayers thick. In still other embodiments, all of the base semiconductor portions may be a different number of monolayers thick.

Figure 4A:
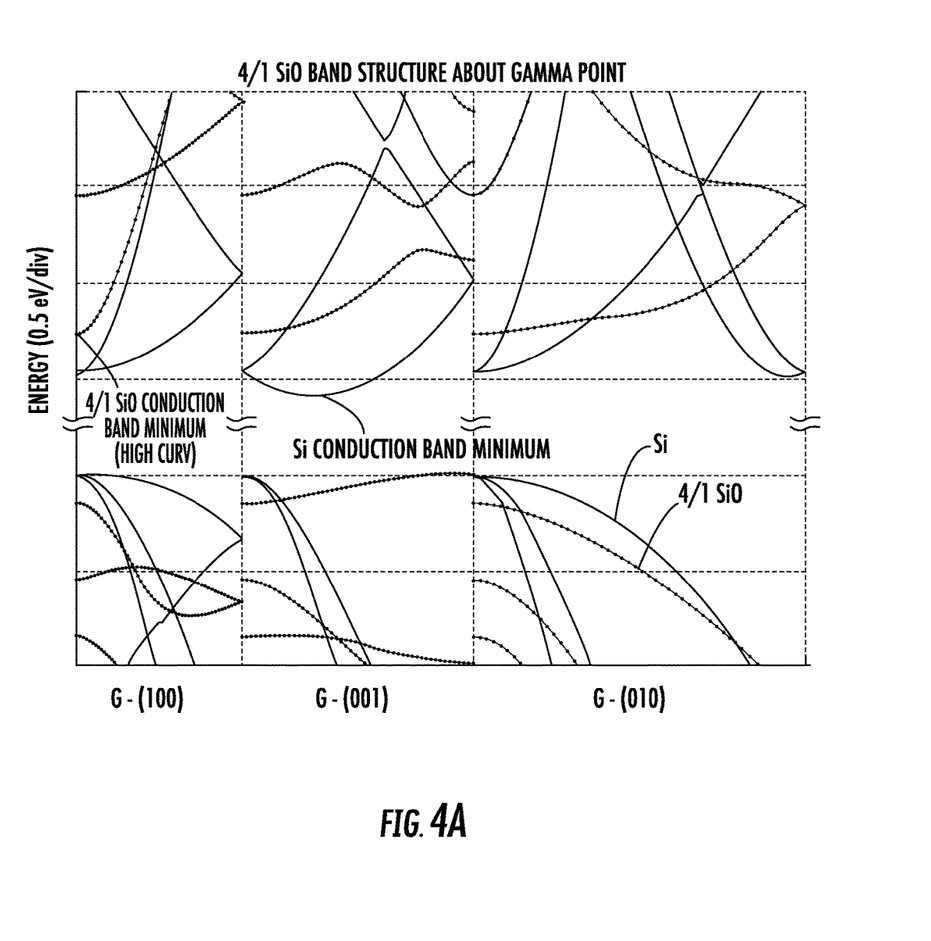
FIG. 4A is a graph of the calculated band structure from the gamma point (G) for both bulk silicon as in the prior art, and for the 4/1 Si/O superlattice as shown in FIGS. 1-2.
Figure 4B:
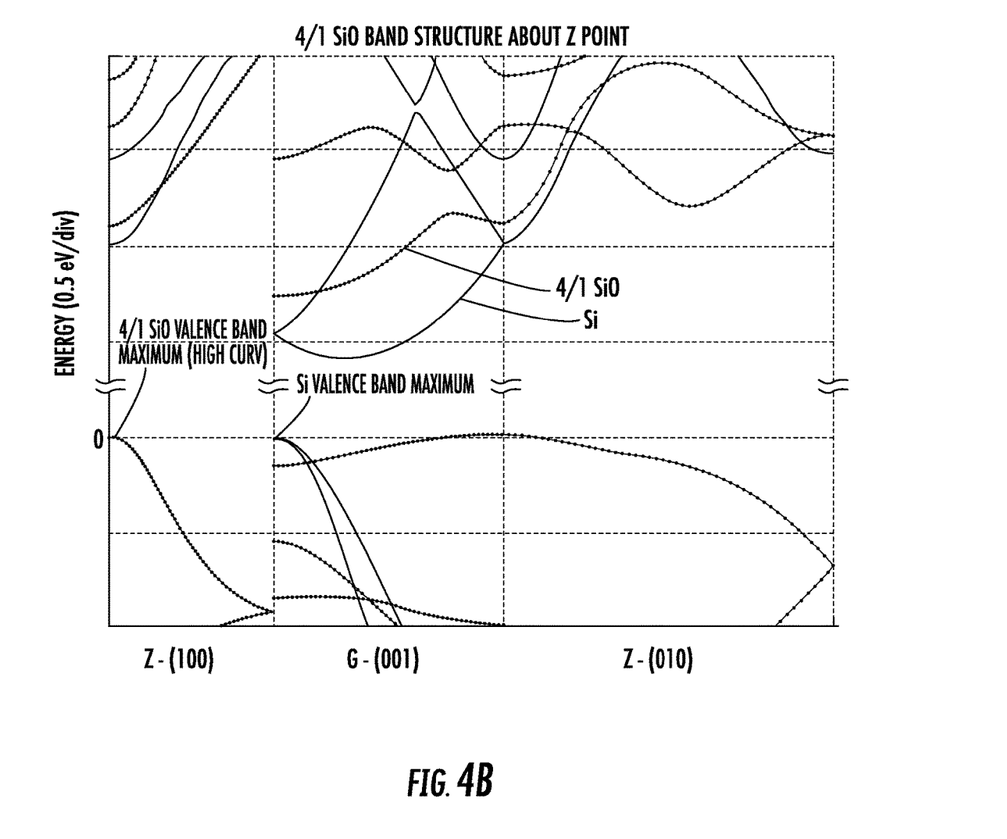
FIG. 4B is a graph of the calculated band structure from the Z point for both bulk silicon as in the prior art, and for the 4/1 Si/O superlattice as shown in FIGS. 1-2.
Figure 4C:
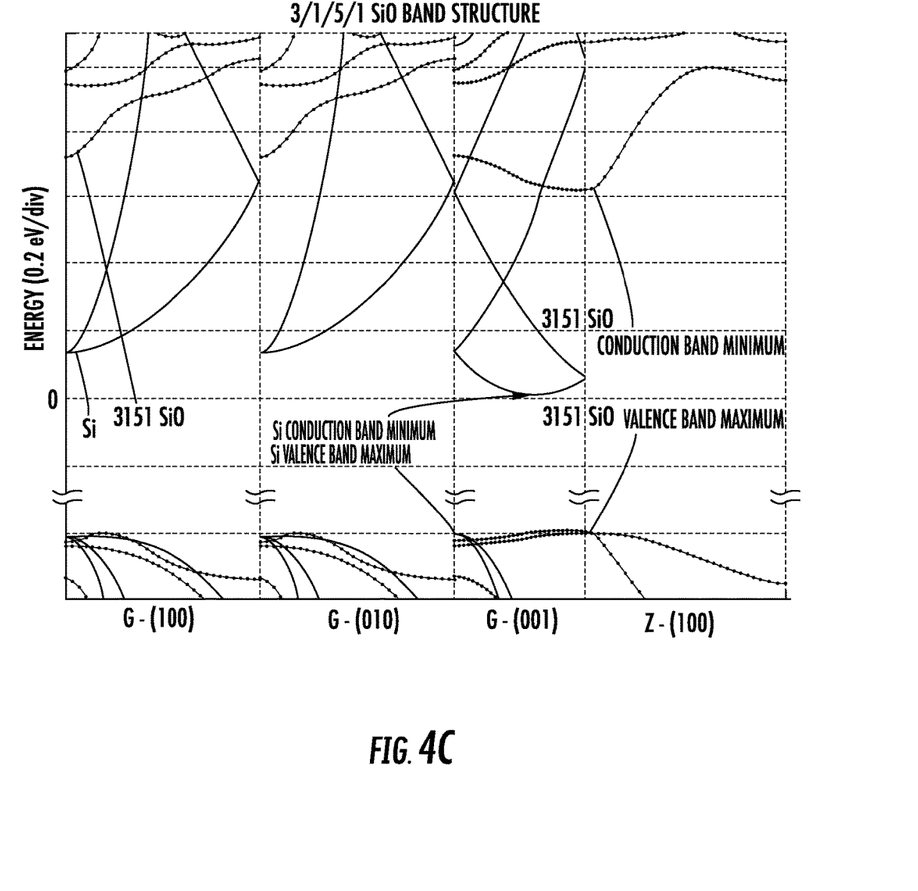
FIG. 4C is a graph of the calculated band structure from both the gamma and Z points for both bulk silicon as in the prior art, and for the 5/1/3/1 Si/O superlattice as shown in FIG. 3.
Figure 5:
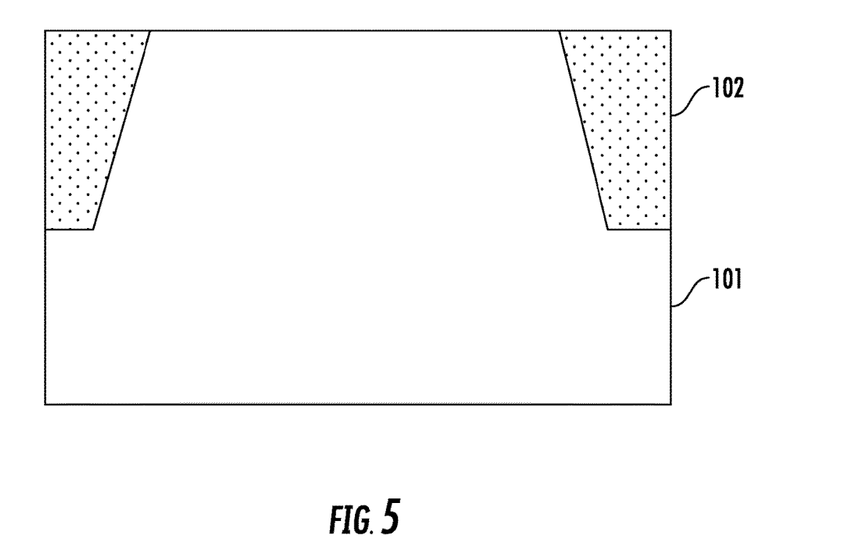
FIGS. 5-14 are a series of schematic cross-sectional diagrams illustrating a method for making a semiconductor device including a plurality of impurity and point defect blocking superlattice layers in accordance with an example embodiment.

In FIGS. 4A-4C, band structures calculated using Density Functional Theory (DFT) are presented. It is well known in the art that DFT underestimates the absolute value of the bandgap. Hence all bands above the gap may be shifted by an appropriate "scissors correction." However the shape of the band is known to be much more reliable. The vertical energy axes should be interpreted in this light.

FIG. 4A shows the calculated band structure from the gamma point (G) for both bulk silicon (represented by continuous lines) and for the 4/1 Si/O superlattice 25 shown in FIG. 1 (represented by dotted lines). The directions refer to the unit cell of the 4/1 Si/O structure and not to the conventional unit cell of Si, although the (001) direction in the figure does correspond to the (001) direction of the conventional unit cell of Si, and, hence, shows the expected location of the Si conduction band minimum. The (100) and (010) directions in the figure correspond to the (110) and (−110) directions of the conventional Si unit cell. Those skilled in the art will appreciate that the bands of Si on the figure are folded to represent them on the appropriate reciprocal lattice directions for the 4/1 Si/O structure.

It can be seen that the conduction band minimum for the 4/1 Si/O structure is located at the gamma point in contrast to bulk silicon (Si), whereas the valence band minimum occurs at the edge of the Brillouin zone in the (001) direction which we refer to as the Z point. One may also note the greater curvature of the conduction band minimum for the 4/1 Si/O structure compared to the curvature of the conduction band minimum for Si owing to the band splitting due to the perturbation introduced by the additional oxygen layer.

FIG. 4B shows the calculated band structure from the Z point for both bulk silicon (continuous lines) and for the 4/1 Si/O superlattice 25 (dotted lines). This figure illustrates the enhanced curvature of the valence band in the (100) direction.

FIG. 4C shows the calculated band structure from both the gamma and Z point for both bulk silicon (continuous lines) and for the 5/1/3/1 Si/O structure of the superlattice 25' of FIG. 3 (dotted lines). Due to the symmetry of the 5/1/3/1 Si/O structure, the calculated band structures in the (100) and (010) directions are equivalent. Thus the conductivity effective mass and mobility are expected to be isotropic in the plane parallel to the layers, i.e. perpendicular to the (001) stacking direction. Note that in the 5/1/3/1 Si/O example the conduction band minimum and the valence band maximum are both at or close to the Z point.

Although increased curvature is an indication of reduced effective mass, the appropriate comparison and discrimination may be made via the conductivity reciprocal effective mass tensor calculation. This leads Applicants to further theorize that the 5/1/3/1 superlattice 25' should be substantially direct bandgap. As will be understood by those skilled in the art, the appropriate matrix element for optical transition is another indicator of the distinction between direct and indirect bandgap behavior.

Turning to FIGS. 5-14, a semiconductor device 100 and associated method for making the device are now described. By way of background, there is a significant amount of research and development ongoing in the area of integrating silicon alloys, pure germanium, and compound semiconductors on patterned and un-patterned silicon. These materials, more often than not, are not latticed matched to silicon. Lattice mismatch results in strain. As the depositing material thickness increases during growth, it eventually reaches a critical stress level at which point the strain is eliminated via threading and misfit dislocation generation. The relaxation process allows the material to relax to its natural lattice parameter.

However, the dislocations have a negative impact on the electronic devices that will eventually be built in the epitaxial material. Some approaches that have been used to reduce the number of defects that extend into the active area include graded buffer layers, aspect ratio trapping in pattern wafers, and elevated temperature annealing applied to the growth and post processing. Dislocation defects may also act as pathways for elements in the alloyed and compound semiconductors to diffuse into the underlying buffers and silicon. Atoms that diffuse along dislocations into the silicon may act as dopants in the silicon. An example would be indium gallium arsenide (InGaAs), and indium phosphide (InP) growth on a germanium buffer on a silicon substrate. An example of such a structure is set forth in Waldron et al., "Integration of InGaAs Channel n-MOS Devices on 200 mm Si Wafers Using the Aspect-Ratio-Trapping Technique", Journal ECSTrans. Volume 45, Issue 4, Pages 115-128 (2012), which is hereby incorporated herein in its entirety by reference.

Figure 6:
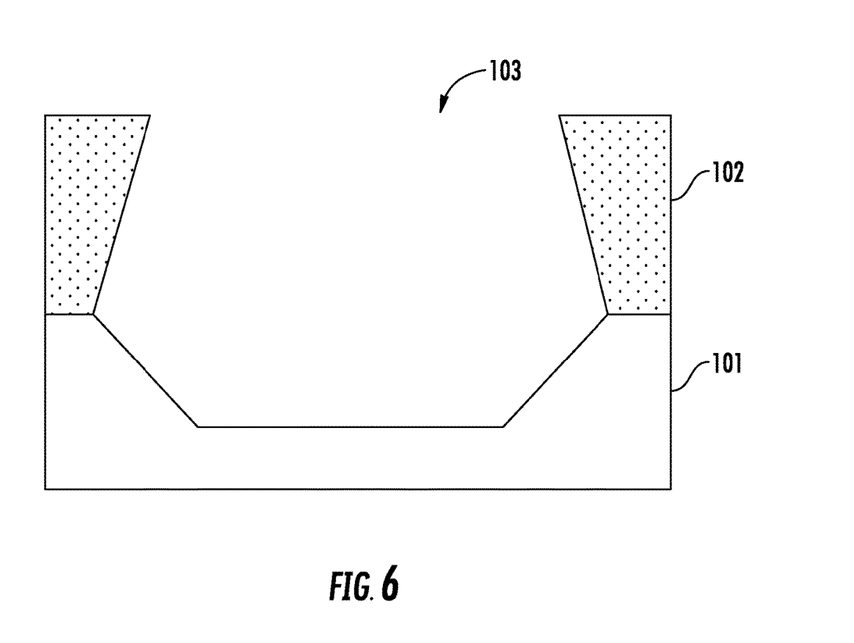

In accordance with an example implementation, one or more MST layers, such as those described above, may be incorporated in semiconductor devices such as the FINFET described in Waldron et al. to advantageously reduce dislocation defects. More particularly, beginning with a silicon substrate 101 with shallow trench isolation (STI) regions 102, a recess 103 is etched in the silicon between adjacent STI regions (FIG. 6).

Figure 7:
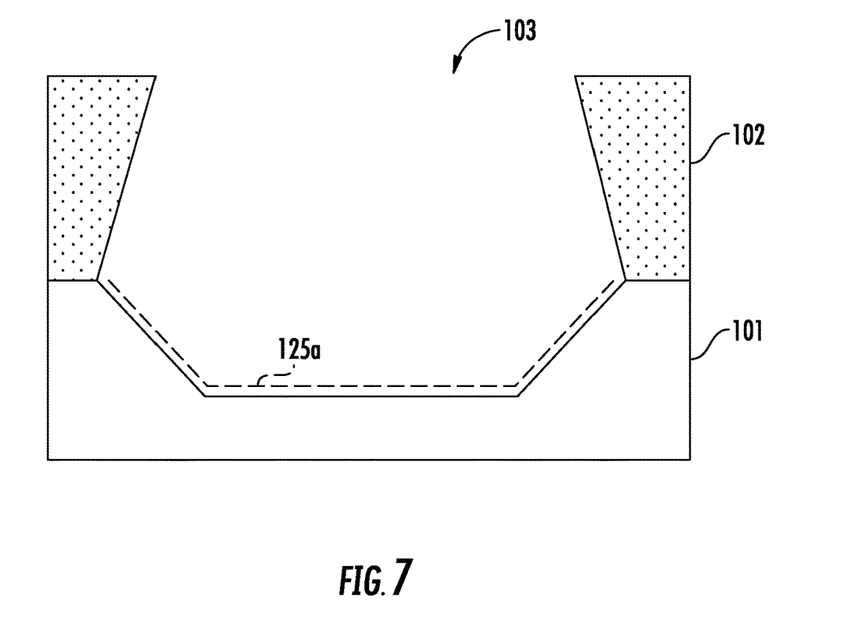
Figure 8:
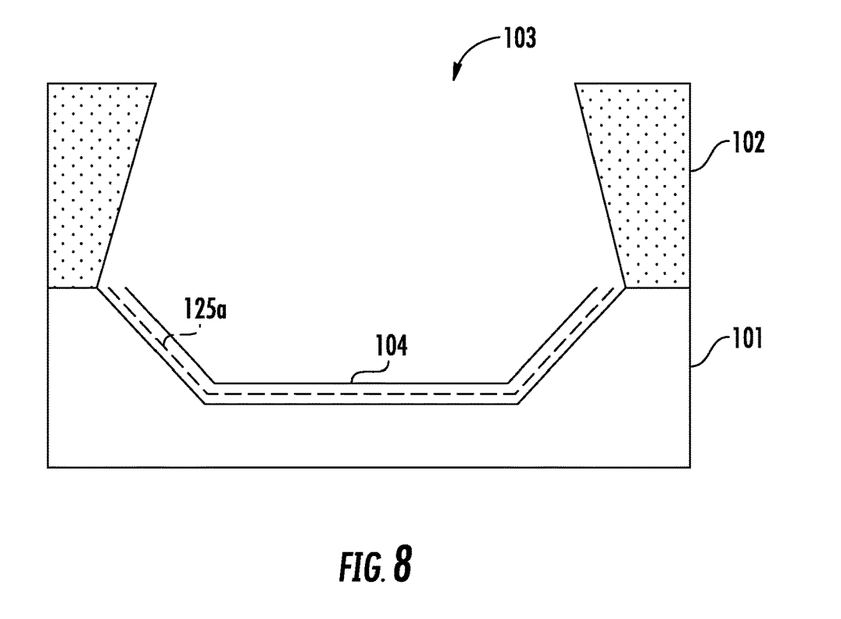
Figure 9:
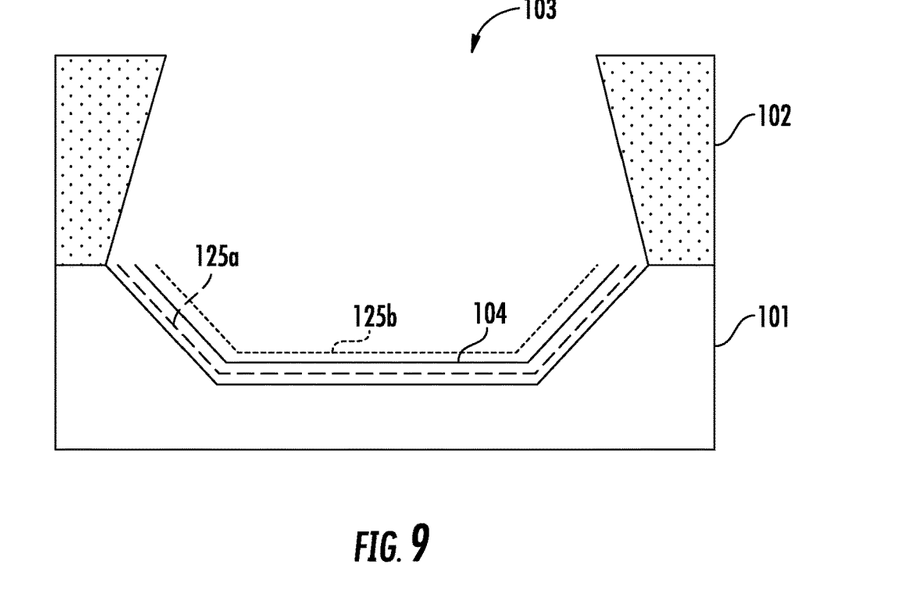
Figure 10:
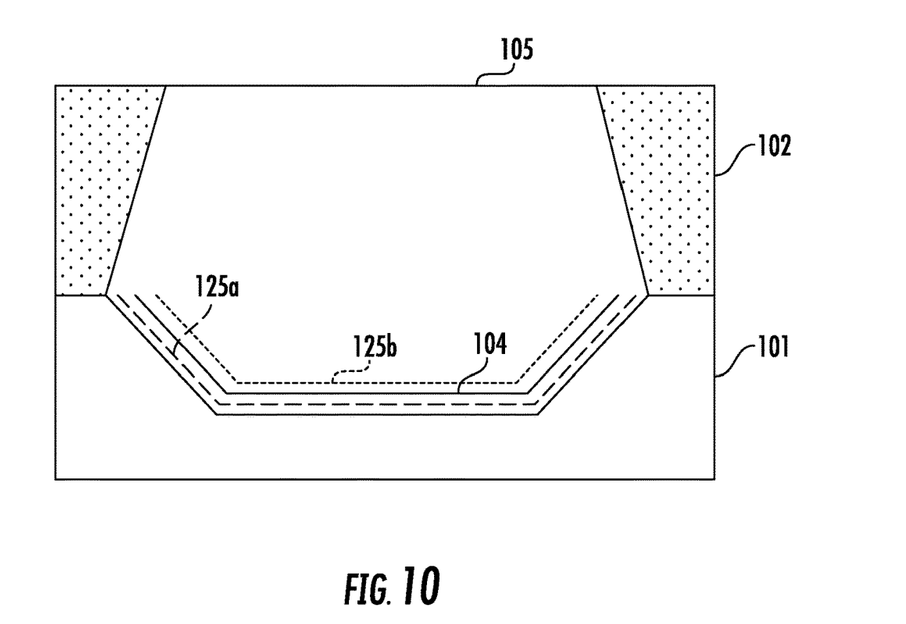

Rather than forming a germanium buffer layer directly on the silicon substrate 101 within the trench 103, as in the above-noted FINFET device, an MST impurity and point defect blocking superlattice layer 125a may first be formed (FIG. 7). The superlattice layer 125a advantageously provides a compliant surface, in addition to impurity and point defect blocking, for subsequently deposited compound Group III-V semiconductor materials, as will be discussed further below. More particularly, the elements in the compound semiconductors are impurities/dopants in silicon, and conversely Group IV semiconductors (silicon and germanium) are impurities/dopants in the compound semiconductors. Thus, it is undesirable for the elements of the different stack layers to intermix. However, by inserting the superlattice layer 125a between the silicon substrate 101 and Group IV buffer layer 104 (germanium in the present example), this advantageously helps prevent the group III-V materials (e.g., phosphorus in the case of an InP active layer) from diffusing into the silicon.

Germanium with a diamond cubic structure, which has a lattice parameter of 5.658 Å, may be used as the buffer layer 104 above the silicon substrate 101, which also has a diamond cubic crystal structure with a lattice parameter of 5.431 Å. The germanium lattice parameter is more closely matched to the Group III-V semiconductor active layer 105 that will be subsequently deposited. In the present example, the Group III-V compound semiconductor is InP, which has a zinc blend crystal structure with a lattice parameter of 5.869 Å, although other suitable materials may also be used. For example, tin is larger than Ge and buffers of GeSn may be deposited such that an alloy with lattice matching to the compound semiconductor (i.e., compound semiconductors with lattice parameter greater than Ge) may be achieved.

In a typical process where the germanium is deposited directly on a silicon substrate, many dislocations are generated, relaxing the strain due to germanium lattice mismatch with silicon. The geometry of the recess 103 bottom, in conjunction with epitaxial growth between the STI side walls 102, cause many of the dislocations to propagate along <111> planes that are at 57.7° angles to the bottom growth surface, to be annihilated when they meet the STI side walls. Yet, the advantageous "Aspect Ratio Trapping" (ART) defect reduction provided by the superlattice layer 125a may not be possible with growth on un-patterned substrates. More particularly, even with the current state of the art techniques noted above, there may still be dislocations that make it to the surface where the active devices will be built, as will be appreciated by those skilled in the art.

In the present example, an additional MST impurity and point defect blocking superlattice layer 125b is also formed above the germanium layer, and prior to formation of the active layer 105, to provide further dopant blocking and defect trapping as well. By way of example, the first and second superlattice layers 125a, 125b may have a 4/1 or 3/1-5/1 configuration as described above, or other configurations (e.g., 12/1, etc.). They may have the same layer configuration, or different layer configurations may be used for the two superlattices 125a, 125b. Moreover, the same or different materials may be used for the different superlattices. For example, the base semiconductor in the lower superlattice layer 125a may be silicon, while the base semiconductor in the upper superlattice layer 125b may be silicon germanium or pure germanium. However, it should be noted that the second superlattice layer 125b is optional and need not be included in all embodiments. It should also be noted that the superlattices 125a, 125b are schematically shown as exaggerated long and short dash lines in the drawings, and the buffer layer 103 is schematically shown as an exaggerated solid line, for clarity of illustration.

Without the impurity and point defect blocking superlattice layer 125a and/or 125b, regions of silicon in the substrate 101 just below the germanium buffer layer 104 will tend to form that are heavily doped with phosphorus from the active InP layer 105 diffusing into the silicon. These impurities make their way into the silicon substrate 101, at an enhanced rate, along the above-described defects. Yet, the blocking/gettering features of the MST material will advantageously inhibit the movement of impurities into the substrate.

In addition to dopant blocking of impurities from one layer to the next, use of the MST superlattice layer 125a and/or 125b provide a compliant substrate to allow stress related defects to be generated earlier in the growth process. The early nucleation will increase the probability of the growth defects being annihilated early such that fewer reach the active area of the device 100. Early nucleation and annihilation of defects may advantageously reduce the height necessary for the compound semiconductor to be grown between the STI regions 102 before acceptable defect levels have been achieved.

Figure 11:
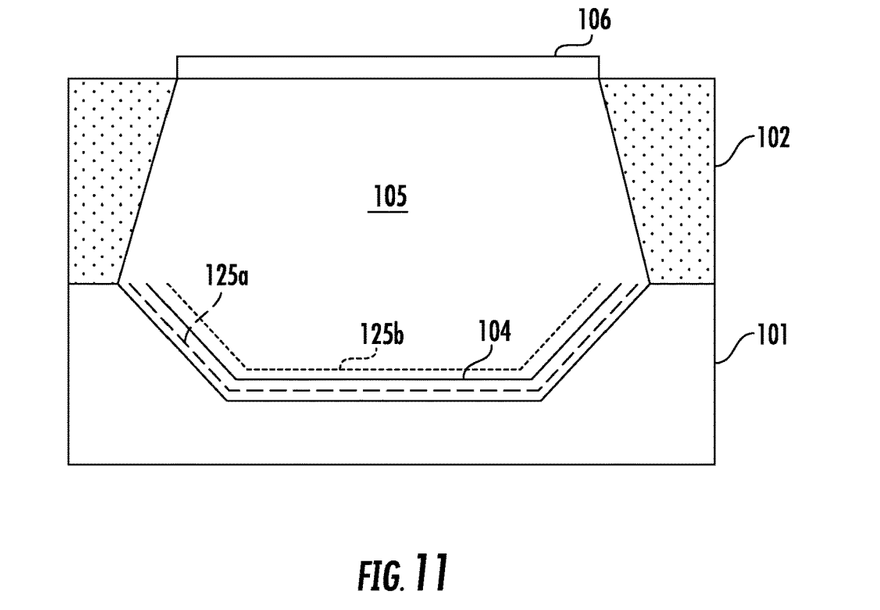
Figure 12:
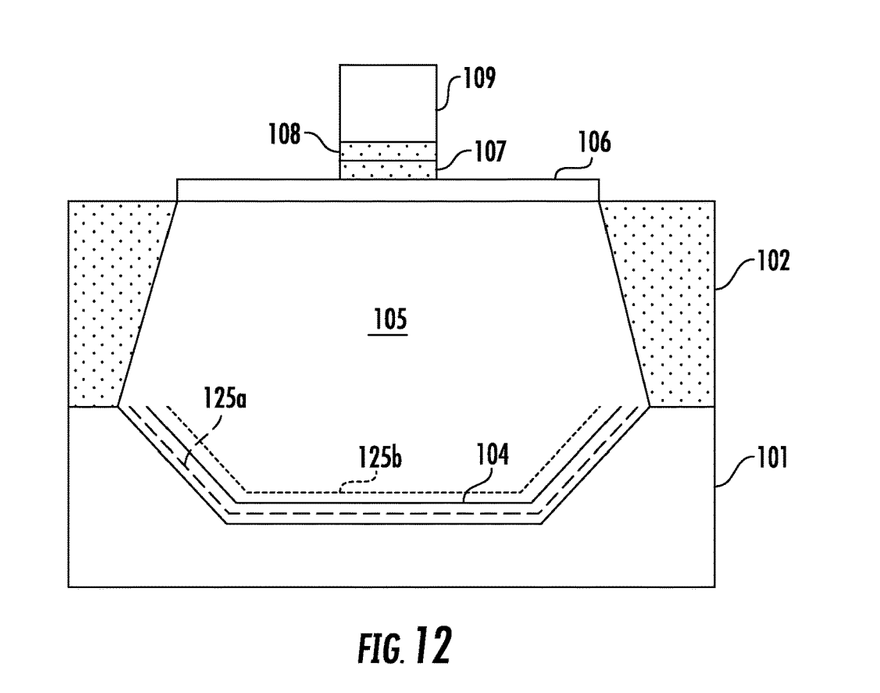
Figure 13:
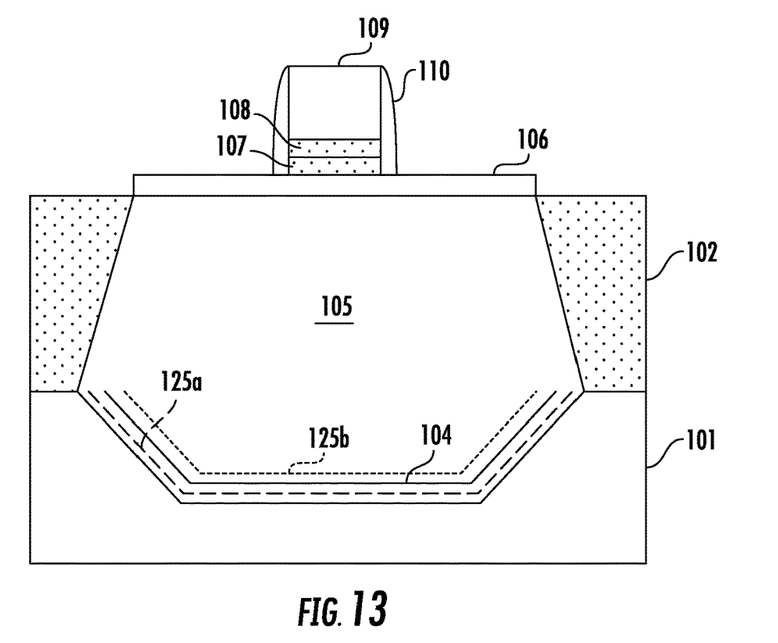
Figure 14:
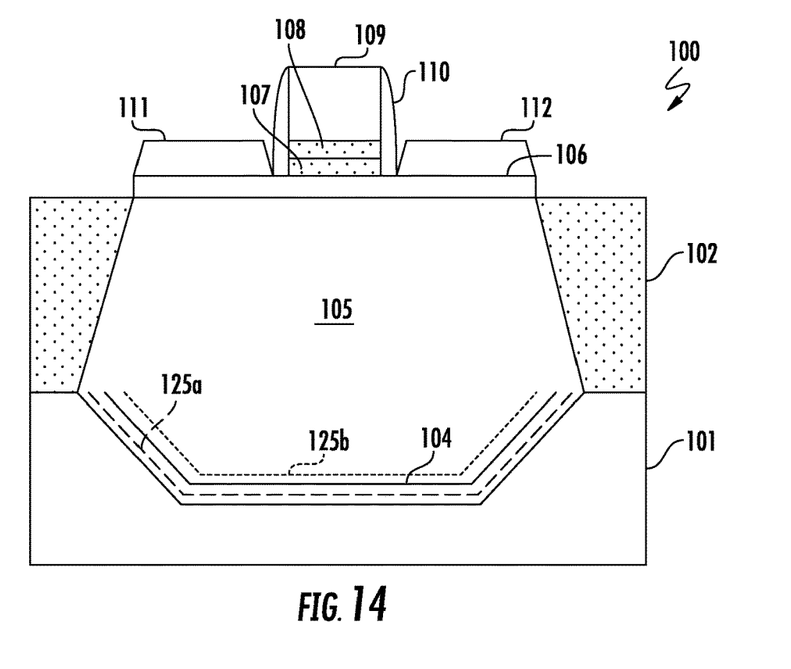

After formation of the active layer 105, a Group III-V channel layer 106 is formed on the active layer (FIG. 11). In the present example, the channel layer 106 is InGaAs, although different materials may be used in different embodiments. A gate stack may then be formed on the channel layer 106 (FIG. 12), which illustratively includes an insulating layer 107 (e.g., $Al_2O_3$), a gate metal layer 108 (e.g., TiN), and a gate electrode 109. The gate electrode may include a metal(s) that is tailored either to the N-MOS or P-MOS transistor. These metals may include a single element or an alloy, e.g., Ti, TiC, TiAlC, TaC, TaAlC. Sidewall spacers 110 and source/drain regions 111, 112 may then be formed (FIGS. 13 and 14) on opposite sides of the gate stack. The source 111 and drain 112 may also be of the same Group III-V semiconductor as the channel layer 106, which in the present example is InGaAs. Further processing steps may include standard W-plug metal processing (not shown), as will be appreciated by those skilled in the art.

Generally speaking, the above-described approach of including one or more MST impurity and point defect blocking layers to epitaxially grown structures may be used where it is desired to reduce/eliminate strain related to epitaxial mismatch, and to prevent elements of each individual layer from intermixing. That is, this approach provides a way to block the intermixing of elemental species between epitaxial layers of different materials. It also takes advantage of the MST material as a compliant layer for reducing defects that result when performing heteroepitaxial growth. By way of example, the above described approach may advantageously be implemented in logic devices (e.g., including FINFETs), as well as for heteroepitaxial growth related to optical material integration into silicon technology.

Many modifications and other embodiments of the invention will come to the mind of one skilled in the art having the benefit of the teachings presented in the foregoing descriptions and the associated drawings. Therefore, it is understood that the invention is not to be limited to the specific embodiments disclosed, and that modifications and embodiments are intended to be included within the scope of the appended claims.

That which is claimed is:

1. A semiconductor device comprising:
   a substrate comprising a first Group IV semiconductor having a recess therein;
   an active layer comprising a Group III-V semiconductor within the recess;
   a buffer layer between the substrate and the active layer and comprising a second Group IV semiconductor;

a first impurity and point defect blocking superlattice layer between and in contact with the substrate and the buffer layer; and a second impurity and point defect blocking superlattice layer between and in contact with the buffer layer and the active layer.

2. The semiconductor device of claim 1 wherein at least one of the first and second impurity and point defect blocking superlattice layers comprises a plurality of stacked groups of layers, each group of layers comprising a plurality of stacked base semiconductor monolayers defining a base semiconductor portion, and at least one non-semiconductor monolayer constrained within a crystal lattice of adjacent base semiconductor portions.

3. The semiconductor device of claim 2 wherein the base semiconductor layers comprise silicon monolayers.

4. The semiconductor device of claim 2 wherein the base semiconductor layers comprise germanium.

5. The semiconductor device of claim 2 wherein the at least one non-semiconductor monolayer comprises at least one of oxygen, nitrogen, fluorine, carbon and carbon-oxygen.

6. The semiconductor device of claim 1 wherein the first Group IV semiconductor comprises silicon.

7. The semiconductor device of claim 1 wherein the second Group IV semiconductor comprises germanium.

8. The semiconductor device of claim 1 wherein the Group III-V semiconductor comprises InP.

9. The semiconductor device of claim 1 further comprising:
a channel layer on the active layer;
a gate on the channel layer; and
a source and a drain on opposite sides of the gate.

10. The semiconductor device of claim 9 wherein the Group III-V semiconductor of the active layer comprises a first Group III-V semiconductor; and wherein the channel layer comprises a second Group III-V semiconductor different than the first Group III-V semiconductor.

11. The semiconductor device of claim 10 wherein the second Group III-V semiconductor comprises InGaAs.

12. The semiconductor device of claim 10 wherein the source and drain also comprise the second Group III-V semiconductor.

13. A semiconductor device comprising:
a substrate comprising a first Group IV semiconductor having a recess therein;
an active layer comprising a Group III-V semiconductor within the recess;
a buffer layer between the substrate and the active layer and comprising a second Group IV semiconductor;
a first impurity and point defect blocking superlattice layer between and in contact with the substrate and the buffer layer and comprising a plurality of stacked groups of layers, each group of layers comprising a plurality of stacked base monolayers of the first Group IV semiconductor defining a first base semiconductor portion, and at least one first non-semiconductor monolayer constrained within a crystal lattice of adjacent first base semiconductor portions; and
a second impurity and point defect blocking superlattice layer between and in contact with the buffer layer and the active layer and comprising a plurality of stacked groups of layers, each group of layers comprising a plurality of stacked base monolayers of the second Group IV semiconductor defining a second base semiconductor portion, and at least one second non-semiconductor monolayer constrained within a crystal lattice of adjacent second base semiconductor portions.

14. The semiconductor device of claim 13 wherein the first and second non-semiconductor monolayers comprise at least one of oxygen, nitrogen, fluorine, carbon and carbon-oxygen.

15. The semiconductor device of claim 13 wherein the first Group IV semiconductor comprises silicon.

16. The semiconductor device of claim 13 wherein the second Group IV semiconductor comprises germanium.

17. The semiconductor device of claim 13 wherein the Group III-V semiconductor comprises InP.

18. The semiconductor device of claim 13 further comprising:
a channel layer on the active layer;
a gate on the channel layer; and
a source and a drain on opposite sides of the gate.

19. The semiconductor device of claim 18 wherein the Group III-V semiconductor of the active layer comprises a first Group III-V semiconductor; and wherein the channel layer comprises a second Group III-V semiconductor different than the first Group III-V semiconductor.

20. The semiconductor device of claim 19 wherein the second Group III-V semiconductor comprises InGaAs.

21. The semiconductor device of claim 19 wherein the source and drain also comprise the second Group III-V semiconductor.

22. A semiconductor device comprising:
a substrate comprising a first Group IV semiconductor having a recess therein;
an active layer comprising a Group III-V semiconductor within the recess;
a buffer layer between the substrate and the active layer and comprising a second Group IV semiconductor;
a first impurity and point defect blocking superlattice layer between and in contact with the substrate and the buffer layer; and
a second impurity and point defect blocking superlattice layer between and in contact with the buffer layer and the active layer;
the first and second impurity and point defect blocking superlattice layers each comprising a plurality of stacked groups of layers, each group of layers comprising a plurality of stacked base semiconductor monolayers defining a base semiconductor portion, and at least one non-semiconductor monolayer constrained within a crystal lattice of adjacent base semiconductor portions.

23. The semiconductor device of claim 22 wherein the base semiconductor layers comprise silicon monolayers, and the at least one non-semiconductor monolayer comprises oxygen.

24. The semiconductor device of claim 22 wherein the first Group IV semiconductor comprises silicon, and the second Group IV semiconductor comprises germanium.

25. The semiconductor device of claim 22 wherein the Group III-V semiconductor comprises InP.

* * * * *